(12) United States Patent
Lin et al.

(10) Patent No.: US 10,256,210 B2
(45) Date of Patent: Apr. 9, 2019

(54) SEMICONDUCTOR PACKAGE STRUCTURE AND METHOD FOR FORMING THE SAME

(71) Applicant: MediaTek Inc., Hsin-Chu (TW)

(72) Inventors: Tzu-Hung Lin, Zhubei (TW);
Ching-Wen Hsiao, Hsinchu (TW);
I-Hsuan Peng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/696,247

(22) Filed: Sep. 6, 2017

(65) Prior Publication Data

US 2017/0373038 A1 Dec. 28, 2017

Related U.S. Application Data

(63) Continuation of application No. 15/184,657, filed on Jun. 16, 2016, now Pat. No. 9,786,632.
(Continued)

(51) Int. Cl.
*H01L 25/065* (2006.01)
*H01L 23/538* (2006.01)
(Continued)

(52) U.S. Cl.
CPC ........ *H01L 25/0652* (2013.01); *H01L 21/486* (2013.01); *H01L 21/56* (2013.01); *H01L 23/49827* (2013.01); *H01L 23/49894* (2013.01); *H01L 23/5389* (2013.01); *H01L 24/11* (2013.01); *H01L 24/16* (2013.01); *H01L 24/24* (2013.01); *H01L 24/32* (2013.01); *H01L 24/82* (2013.01); *H01L 24/97* (2013.01); *H01L 25/16* (2013.01); *H01L 25/50* (2013.01); *H01L 24/13* (2013.01); *H01L 24/29* (2013.01); *H01L 24/73* (2013.01); *H01L 24/92* (2013.01); *H01L 2021/60015* (2013.01); *H01L 2021/60232* (2013.01); *H01L 2224/0401* (2013.01);
(Continued)

(58) Field of Classification Search
CPC ..... H01L 25/0652; H01L 25/50; H01L 25/16; H01L 24/32; H01L 21/56; H01L 25/486
See application file for complete search history.

(56) References Cited

U.S. PATENT DOCUMENTS 6,239,366 B1 5/2001 Hsuan
8,754,514 B2 6/2014 Yu et al.
(Continued)

FOREIGN PATENT DOCUMENTS

CN 101015057 A 8/2007
CN 101083244 A 12/2007
(Continued)

*Primary Examiner* — A. Sefer
(74) *Attorney, Agent, or Firm* — McClure, Qualey & Rodack, LLP

(57) ABSTRACT

A semiconductor package structure has a first electronic component on an insulating layer, a dielectric layer on the insulating layer and surrounding the first electronic component, a second electronic component stacked on the first electronic component, wherein an active surface of the first electronic component faces an active surface of the second electronic component, a molding compound on the first electronic component and surrounding the second electronic component, a third electronic component stacked on the second electronic component and the molding compound.

22 Claims, 7 Drawing Sheets

Related U.S. Application Data

(60) Provisional application No. 62/198,871, filed on Jul. 30, 2015.

(51) Int. Cl.
*H01L 21/48* (2006.01)
*H01L 21/56* (2006.01)
*H01L 23/498* (2006.01)
*H01L 25/16* (2006.01)
*H01L 25/00* (2006.01)
*H01L 23/00* (2006.01)
*H01L 21/60* (2006.01)

(52) U.S. Cl.
CPC ........ *H01L 2224/04105* (2013.01); *H01L 2224/10156* (2013.01); *H01L 2224/11* (2013.01); *H01L 2224/11013* (2013.01); *H01L 2224/11019* (2013.01); *H01L 2224/12105* (2013.01); *H01L 2224/131* (2013.01); *H01L 2224/13147* (2013.01); *H01L 2224/16225* (2013.01); *H01L 2224/16227* (2013.01); *H01L 2224/16237* (2013.01); *H01L 2224/24225* (2013.01); *H01L 2224/2919* (2013.01); *H01L 2224/32225* (2013.01); *H01L 2224/32501* (2013.01); *H01L 2224/73267* (2013.01); *H01L 2224/81* (2013.01); *H01L 2224/82031* (2013.01); *H01L 2224/82039* (2013.01); *H01L 2224/92244* (2013.01); *H01L 2224/97* (2013.01); *H01L 2225/0652* (2013.01); *H01L 2225/06517* (2013.01); *H01L 2225/06548* (2013.01); *H01L 2225/06551* (2013.01); *H01L 2225/06572* (2013.01); *H01L 2225/1035* (2013.01); *H01L 2225/1041* (2013.01); *H01L 2225/1058* (2013.01); *H01L 2225/1094* (2013.01); *H01L 2924/1431* (2013.01); *H01L 2924/1432* (2013.01); *H01L 2924/1434* (2013.01); *H01L 2924/1436* (2013.01); *H01L 2924/15311* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | |
|---|---|---|
| 2005/0133916 A1 | 6/2005 | Kamezos |
| 2006/0102993 A1 | 5/2006 | Tsai |
| 2007/0164457 A1 | 7/2007 | Yamaguchi et al. |
| 2007/0181998 A1 | 8/2007 | Ha |
| 2007/0209834 A1 | 9/2007 | Kuan |
| 2008/0094793 A1 | 4/2008 | Sakurai et al. |
| 2010/0044845 A1 | 2/2010 | Funaya et al. |
| 2010/0072634 A1 | 3/2010 | Ha |
| 2010/0233852 A1 | 9/2010 | Do |
| 2011/0285007 A1 | 11/2011 | Chi et al. |
| 2012/0211885 A1 | 8/2012 | Choi et al. |
| 2013/0037950 A1* | 2/2013 | Yu .............. H01L 23/49816 257/738 |
| 2014/0106508 A1* | 4/2014 | Sutardja ............. H01L 24/24 438/109 |
| 2014/0217604 A1 | 8/2014 | Chou |
| 2014/0264831 A1 | 9/2014 | Meyer |
| 2015/0079733 A1* | 3/2015 | Oganesian ........... H01L 24/82 438/109 |
| 2015/0171006 A1 | 6/2015 | Hung et al. |
| 2016/0049385 A1 | 2/2016 | Yu |

FOREIGN PATENT DOCUMENTS

| | | |
|---|---|---|
| CN | 101480116 A | 7/2009 |
| CN | 102931173 A | 2/2013 |
| CN | 103168358 A | 6/2013 |
| DE | 102011086354 A1 | 2/2013 |
| WO | WO 2012/012338 A1 | 1/2012 |

\* cited by examiner

SEMICONDUCTOR PACKAGE STRUCTURE AND METHOD FOR FORMING THE SAME

CROSS REFERENCE TO RELATED APPLICATIONS

This application is a Continuation of pending U.S. Utility application Ser. No. 15/184,657, filed on Jun. 16, 2016, which claims the benefit of U.S. Provisional Application No. 62/198,871 filed on Jul. 30, 2015, the entireties of which are incorporated by reference herein.

BACKGROUND OF THE INVENTION

Field of the Invention

The present invention relates to a semiconductor package structure, and in particular to a three-dimensional (3D) system-in-package (SIP) semiconductor package structure and methods for forming the same.

Description of the Related Art

In order to ensure the miniaturization and multi-functionality of electronic products and communication devices (such as wearable devices), it is desired that semiconductor packages be small in size, support multi-pin connection, operate at high speeds, and provide high functionality. A conventional semiconductor package usually places active devices and passive devices on a printed circuit board (PCB). However, a sizable PCB is required to provide area for the active devices and the passive devices mounted thereon. It is hard to reduce the size of semiconductor packages and the size of electronic products formed therefrom.

Thus, a novel semiconductor package structure and methods for forming the same are desirable.

BRIEF SUMMARY OF THE INVENTION

A semiconductor package structure and a method for forming a semiconductor package structure are provided.

An exemplary embodiment of a semiconductor package structure A semiconductor package structure has a first electronic component on an insulating layer, a dielectric layer on the insulating layer and surrounding the first electronic component, a second electronic component stacked on the first electronic component, wherein an active surface of the first electronic component faces an active surface of the second electronic component, a molding compound on the first electronic component and surrounding the second electronic component, a third electronic component stacked on the second electronic component and the molding compound.

Another exemplary embodiment of a semiconductor package structure includes a first electronic component on an insulating layer, a dielectric layer on the insulating layer and surrounding the first electronic component, a second electronic component stacked on the first electronic component, wherein an active surface of the first electronic component faces an active surface of the second electronic component, a molding compound on the dielectric layer and surrounding the second electronic component, and a first conductive layer on the molding compound.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
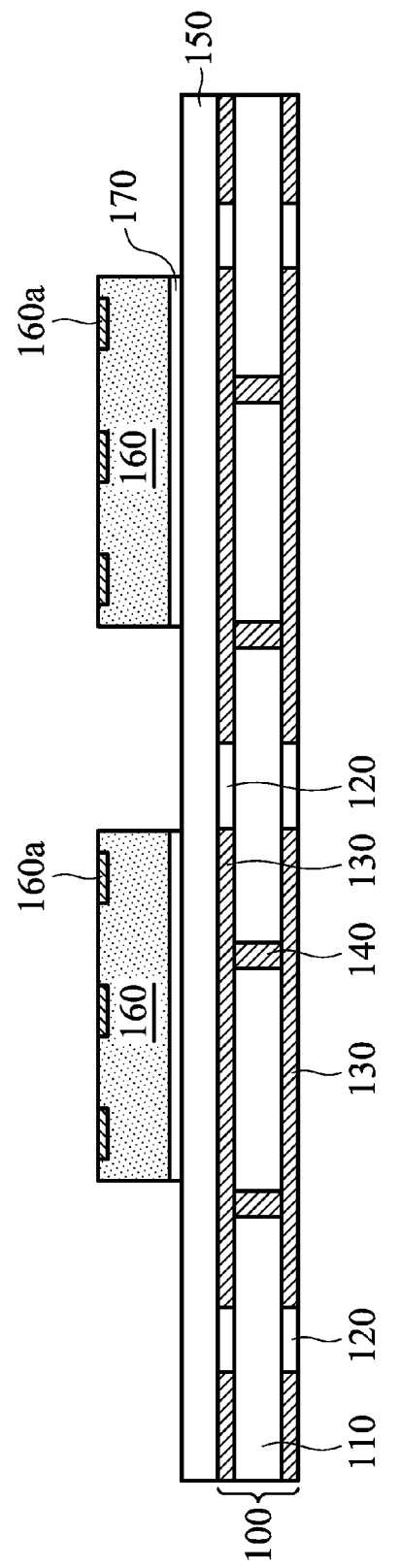
FIGS. 1A-1G are cross-sectional views of various stages of a method for forming a semiconductor package structure, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIGS. 1A-1F are cross-sectional views of various stages of a method for forming a semiconductor package structure, in accordance with some embodiments of the disclosure. Additional operations can be provided before, during, and/or after the stages described in FIGS. 1A-1F. Some of the stages that are described can be replaced or eliminated for different embodiments. Additional features can be added to the semiconductor package structure. Some of the features described below can be replaced or eliminated for different embodiments. To simplify the diagram, only a portion of the semiconductor package structure is depicted in FIGS. 1A-1F.

As shown in FIG. 1A, a substrate 100 is provided. In some embodiments, the substrate 100 is a copper clad laminate (CCL), or another suitable substrate. In some embodiments, the substrate 100 is a panel or a wafer. In some embodiments, the substrate 100 includes an insulating material layer 110, solder resist layers (solder mask layers) 120, conductive layers 130, and vias 140. It should be noted that the configuration of the substrate 100 shown in figures are only examples and are not limitations to the present invention. The substrate 100 may be a single layer or comprise multiple layers (i.e., two layers or more than two layers).

The insulating material layer 110 may be a single insulating layer or include multiple insulating layers. To simplify the diagram, only a single insulating layer is depicted herein as an example. In some embodiments, the insulating material layer 110 includes an organic material. The organic material may include polypropylene (PP) with glass fiber, epoxy resin, polyimide, cyanate ester, another suitable material, or a combination thereof.

The solder resist layers 120 and the conductive layers 130 are disposed on the top and bottom surfaces of the insulating layer 110. The solder resist layers 120 and the conductive layers 130 together completely cover the top and bottom surfaces of the insulating layer 110. The conductive layers 130 on the top and bottom surfaces of the insulating layer 110 are electrically connected to each other through the vias 140 in the insulating layer 110. In some embodiments, the conductive layers 130 and the vias 140 include copper or another suitable conductive material.

Afterwards, a dielectric layer 150 is formed on the substrate 100. The dielectric layer 150 covers the solder resist layers 120 and the conductive layers 130 on the top surface of the insulating layer 110. In some embodiments, the dielectric layer 150 is formed by a deposition process (such as a coating process, a physical vapor deposition process, a chemical vapor deposition process or another suitable process).

Subsequently, one or more first electronic components 160 are bonded on the substrate 100. For example, the first electronic components 160 are attached to the dielectric layer 150 through an adhesive layer 170. In some embodiments, each of the first electronic components 160 includes one or more conductive pads 160a at its front side or active surface. The conductive pads 160a face away from the substrate 100, the dielectric layer 150, and the adhesive layer 170.

In some embodiments, the first electronic components 160 include active components, passive components, or one or more active components and one or more passive components. The active components may be integrated circuit chips/dies or another suitable active component. For example, the first electronic components 160 may be a memory die, a logic die including a central processing unit (CPU), a graphics processing unit (GPU), or a dynamic random access memory (DRAM) controller, or another suitable active electronic component. Alternatively, the first electronic components 160 may be an integrated passive device (IPD), a capacitor, a resistor, an inductor, a varactor diode or another suitable passive component.

Multiple first electronic components 160 may have the same function or different functions. Multiple first electronic components 160 may be the same size or different sizes. The actual number, function and size of the first electronic components 160 are determined by design requirements and they are not limited.

Figure 1B:
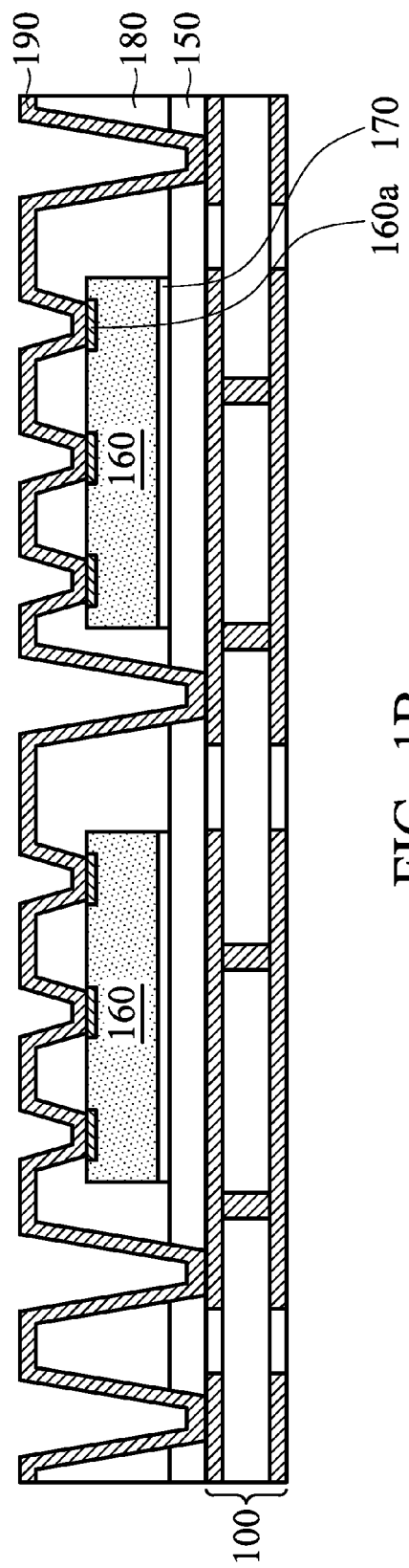

As shown in FIG. 1B, a dielectric layer 180 is formed on the substrate 100. The dielectric layer 180 covers and surrounds the first electronic components 160 and the adhesive layer 170. In some embodiments, the dielectric layer 180 is formed by a deposition process (such as a coating process, a physical vapor deposition process, a chemical vapor deposition process or another suitable process).

Afterwards, multiple openings are formed in the dielectric layer 180 and the dielectric layer 150. Some of the openings penetrate the dielectric layer 180 and the dielectric layer 150 to expose a portion of the conductive layers 130 of the substrate 100. Some of the openings extend in the dielectric layer 180 to expose the conductive pads 160a of the first electronic components 160. In some embodiments, the openings are formed in the dielectric layer 180 and the dielectric layer 150 by a laser drilling process, an etching process or another applicable process.

Subsequently, a conductive layer 190 is formed on the dielectric layer 180 and extends to the bottom and the sidewalls of the openings in the dielectric layer 180 and the dielectric layer 150. As a result, as shown in FIG. 1B, the conductive layer 190 is tortuous as viewed from a cross-sectional view perspective. In some embodiments, the bottom surface of a portion of the conductive layer 190 is non-coplanar with the bottom surface of another portion of the conductive layer 190. In some embodiments, the bottom surface of a portion of the conductive layer 190 in the opening in the dielectric layer 180 is positioned over the first electronic components 160, while the bottom surface of another portion of the conductive layer 190 in another opening in the dielectric layer 180 or 150 is positioned below the first electronic components 160. The conductive layer 190 is electrically connected to the conductive layers 130 of the substrate 100 and the conductive pads 160a through the openings in the dielectric layer 180 and the dielectric layer 150. In some embodiments, the conductive layer 190 is formed by an electroplating process or another applicable process.

Figure 1C:
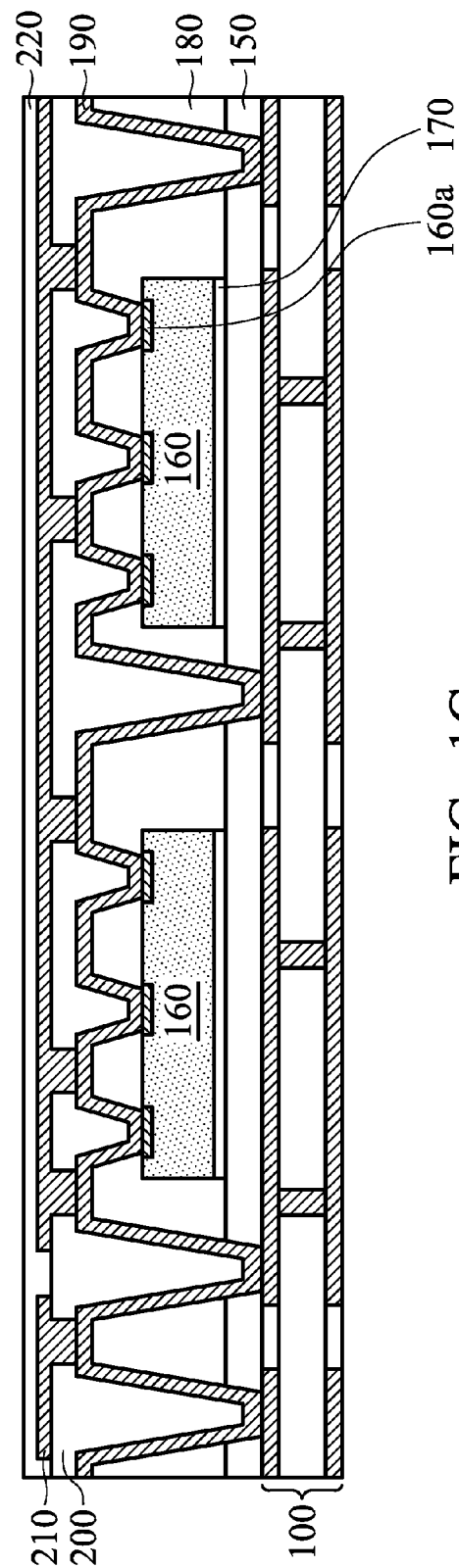

As shown in FIG. 1C, a dielectric layer 200 is formed on the conductive layer 190. The conductive layer 190 and the dielectric layer 200 together completely fill the openings in the dielectric layer 180 and the dielectric layer 150. The dielectric layer 200 further extends on the conductive layer 190 on the dielectric layer 180. In some embodiments, the dielectric layer 200 is formed by a deposition process (such as a coating process, a physical vapor deposition process, a chemical vapor deposition process or another suitable process). The dielectric layer 200 and the dielectric layer 180 may include the same material or different materials.

Afterwards, multiple openings are formed in the dielectric layer 200 to expose a portion of the conductive layer 190 on the dielectric layer 180. In some embodiments, the openings are formed in the dielectric layer 200 by a laser drilling process, an etching process or another applicable process.

Subsequently, a patterned conductive layer 210 is formed on the dielectric layer 200 and fills the openings in the dielectric layer 200. The conductive layer 210 is electrically connected to the conductive layer 190 through the openings in the dielectric layer 200. In some embodiments, the conductive layer 210 is formed by an electroplating process or another applicable process.

A solder mask layer 220 (or a dielectric layer) is then formed on the dielectric layer 200 and covers the conductive layer 210. In some embodiments, the solder mask layer 220 has a flat top surface. In some embodiments, the solder mask layer 220 is formed by a deposition process (such as a coating process, a physical vapor deposition process, a chemical vapor deposition process or another suitable process).

Figure 1D:
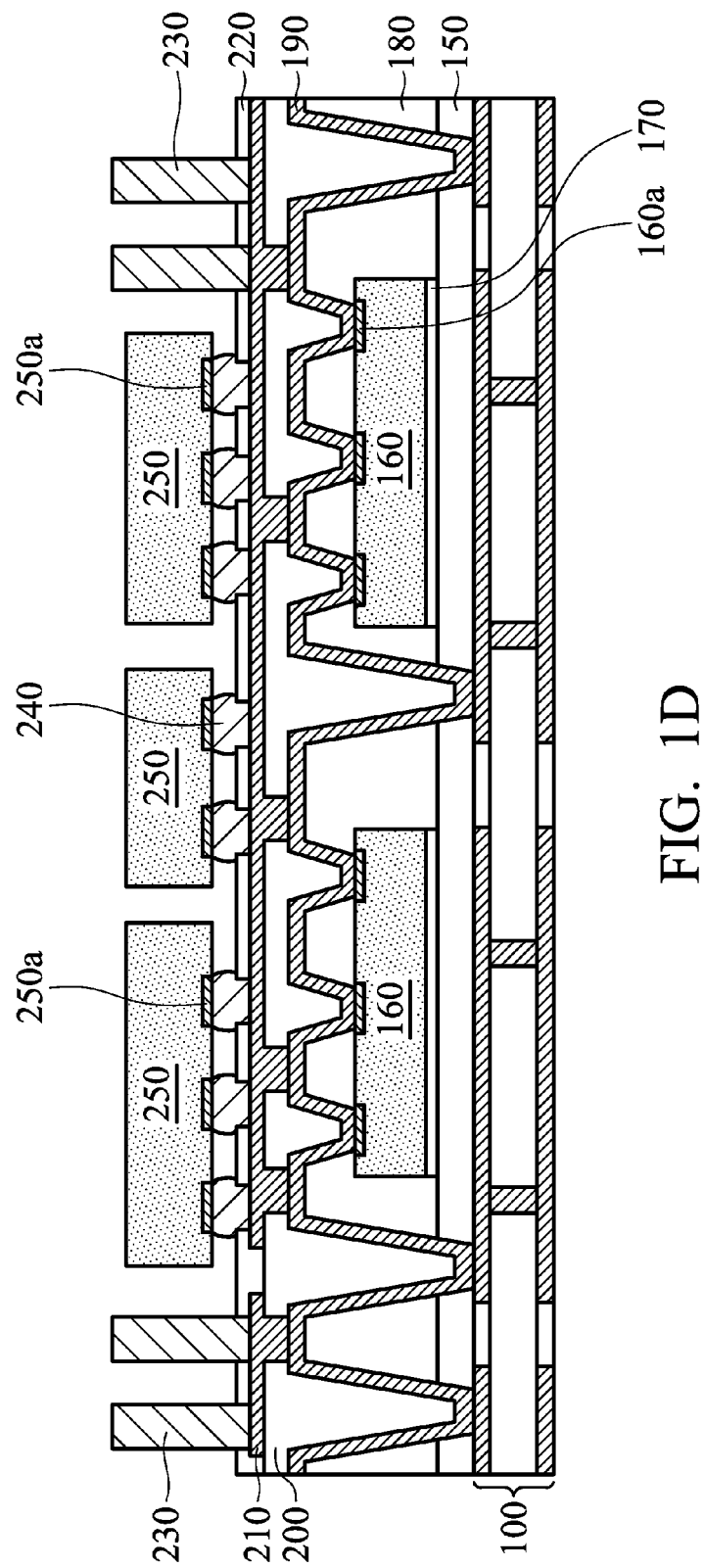

As shown in FIG. 1D, multiple openings are formed in the solder mask layer 220 to expose a portion of the conductive layer 210. In some embodiments, the openings are formed in the solder mask layer 220 by a laser drilling process, an etching process or another applicable process.

Afterwards, one or more conductive pillars 230 are formed on the conductive layer 210. The conductive pillars 230 may be referred to as through interposer vias (TIV). The conductive pillars 230 are electrically and physically connected to some exposed portions of the conductive layer 210 through the openings in the solder mask layer 220. In some embodiments, the conductive pillars 230 vertically overlap the first electronic components 160. In some other embodiments, the conductive pillars 230 do not vertically overlap the first electronic components 160. In some embodiments, the conductive pillars 230 include copper, another suitable conductive material, or a combination thereof. In some embodiments, the conductive pillars 230 are formed by an electroplating process or another applicable process.

Subsequently, one or more second electronic components 250 are provided. In some embodiments, the second electronic components 250 include active components, passive components, or one or more active components and one or more passive components. For example, the second electronic components 250 may be a memory die, a logic die including a CPU, a GPU, or a DRAM controller, or another suitable active electronic component. Alternatively, the second electronic components 250 may be an IPD, a capacitor, a resistor, an inductor, a varactor diode or another suitable passive component.

Multiple second electronic components 250 may have the same function or different functions. Multiple second electronic components 250 may be the same size or different sizes. The actual number, function and size of the second electronic components 250 are determined by design requirements and they are not limited.

In some embodiments, each of the second electronic components 250 includes one or more conductive pads 250a at its front side or active surface. The conductive pads 250a are connected to conductive structures 240. In some embodiments, the conductive structures 240 are conductive bumps, conductive pillars, conductive paste structures, or another suitable conductive structure. The conductive structures 240 may include copper, solder, or another suitable conductive material.

Afterwards, the second electronic components 250 are flipped over and are coupled to some exposed portions of the conductive layer 210 through the conductive structures 240. An applicable process (such as a reflow process) is performed to bond the second electronic components 250. As a result, the conductive pads 250a which are connected to the conductive structures 240 face the substrate 100 and the conductive pads 160a of the first electronic components 160. In other words, the second electronic components 250 and the first electronic components 160 are connected face to face.

As shown in FIG. 1D, the second electronic components 250 are stacked on the first electronic components 160. In some embodiments, the second electronic components 250 vertically overlap the first electronic components 160. In some other embodiments, the second electronic components 250 do not vertically overlap the first electronic components 160. The second electronic components 250 and the first electronic components 160 may have the same function or different functions. The second electronic components 250 and the first electronic components 160 may be the same size or different sizes. The actual number, function and size of the second electronic components 250 and the first electronic components 160 are determined by design requirements and they are not limited.

The second electronic components 250 and the conductive pillars 230 are positioned side by side. In some embodiments, multiple conductive pillars 230 are located on two opposite sides of the second electronic components 250. Namely, one or more of the second electronic components 250 are positioned between multiple conductive pillars 230. In some other embodiments, one or more of the conductive pillars 230 may be positioned between multiple second electronic components 250. In some embodiments, multiple conductive pillars 230 are located around the second electronic components 250 and together surround the second electronic components 250 as viewed from a top-view perspective.

In some embodiments, the thickness of the second electronic components 250 is less than the thickness or height of the conductive pillars 230. In some embodiments, the conductive pillars 230 are higher than the second electronic components 250. In some other embodiments, the top surface of the conductive pillars 230 is substantially coplanar with the top surface of the second electronic components 250.

Figure 1E:
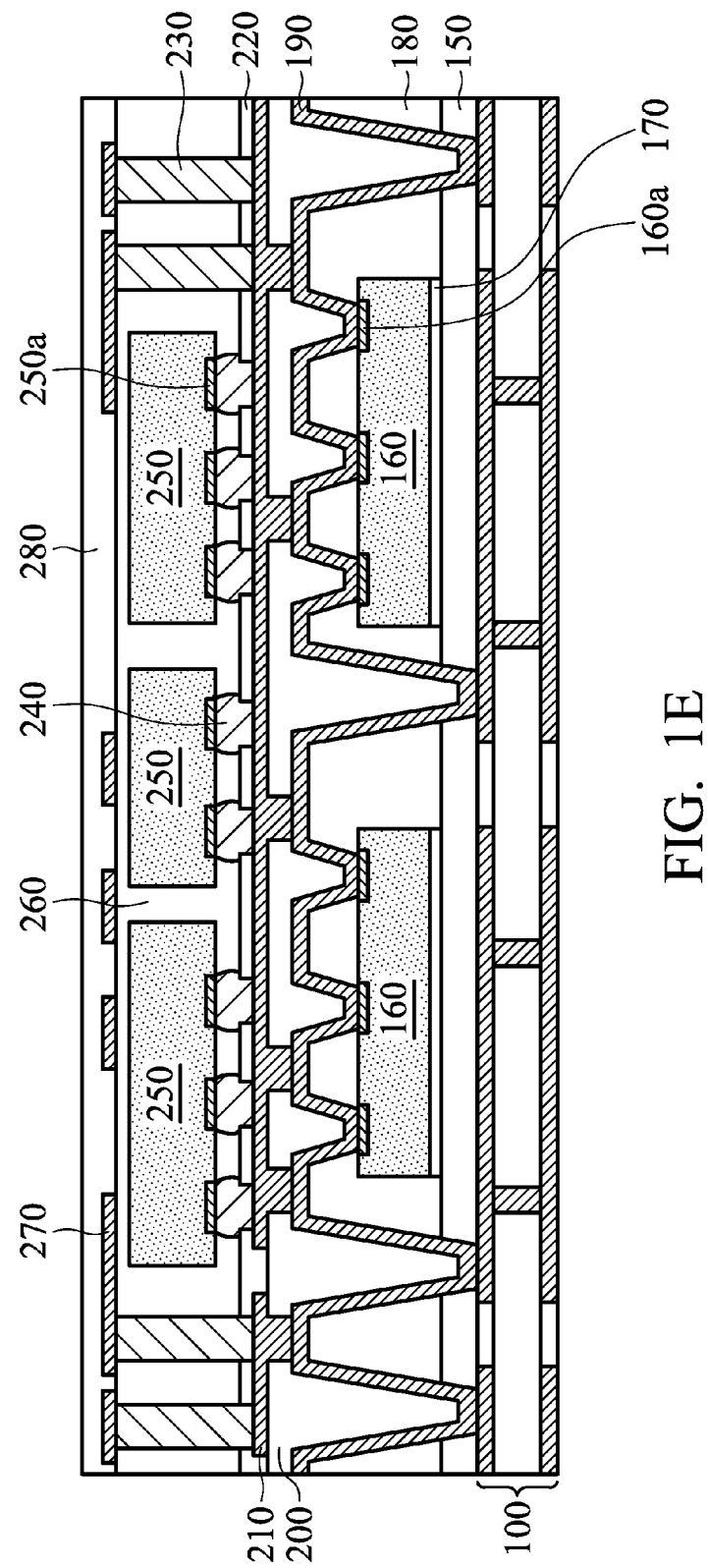

As shown in FIG. 1E, a molding compound 260 is formed on the solder mask layer 220. The molding compound 260 surrounds the conductive pillars 230, the conductive structures 240, and the second electronic components 250. A portion of the bottom of the conductive pillars 230 and the conductive structures 240 is embedded in the solder mask layer 220 and is not enclosed by the molding compound 260. In some embodiments, the second electronic components 250 are immersed in the molding compound 260. In some embodiments, the dielectric layers 150, 180, and 200 and the solder mask layer 220 are located between the molding compound 260 and the substrate 100.

In some embodiments, the molding compound 260 is formed of a nonconductive material such as an epoxy, a resin, a moldable polymer, or another suitable molding material. In some embodiments, the molding compound 260 is applied as a substantial liquid, and then is cured through a chemical reaction. In some other embodiments, the molding compound 260 is an ultraviolet (UV) or thermally cured polymer applied as a gel or malleable solid, and then is cured through a UV or thermal curing process. The molding compound 260 may be cured with a mold.

In some embodiments, the deposited molding compound 260 covers the top surfaces of the second electronic components 250 and the conductive pillars 230. Afterwards, a grinding process is performed to thin the deposited molding compound 260. As a result, the thinned molding compound 260 exposes the top surface of the conductive pillars 230. In some embodiments, the top surface of the molding compound 260 is substantially coplanar with the top surface of the conductive pillars 230. In some embodiments, the molding compound 260 exposes the top surface of the conductive pillars 230 but covers the top surface of the second electronic components 250. In some other embodiments, the top surface of the second electronic components 250 may be exposed from the molding compound 260. In some embodiments, the conductive pillars 230 penetrate the molding compound 260 and protrude from a bottom surface of the molding compound 260.

Subsequently, a patterned conductive layer 270 is formed on the molding compound 260 and is coupled to the conductive pillars 230 exposed from the molding compound 260. A portion of the conductive layer 270 vertically overlaps the second electronic components 250, and is isolated from the second electronic components 250 by the top of the molding compound 260. In other words, a portion of the molding compound 260 is sandwiched between the conductive layer 270 and the second electronic component 250. Another portion of the conductive layer 270 does not vertically overlap the second electronic components 250. In some embodiments, the conductive layer 270 is formed by an electroplating process or another applicable process. In some other embodiments, the conductive layer 270 may be replaced by a redistribution layer (RDL) structure including one or more conductive traces disposed in one or more inter-metal dielectric (IMD) layers.

Afterwards, a solder mask layer 280 is formed on the molding compound 260 and covers the conductive layer 270. In some embodiments, the solder mask layer 280 is formed by a deposition process.

Figure 1F:
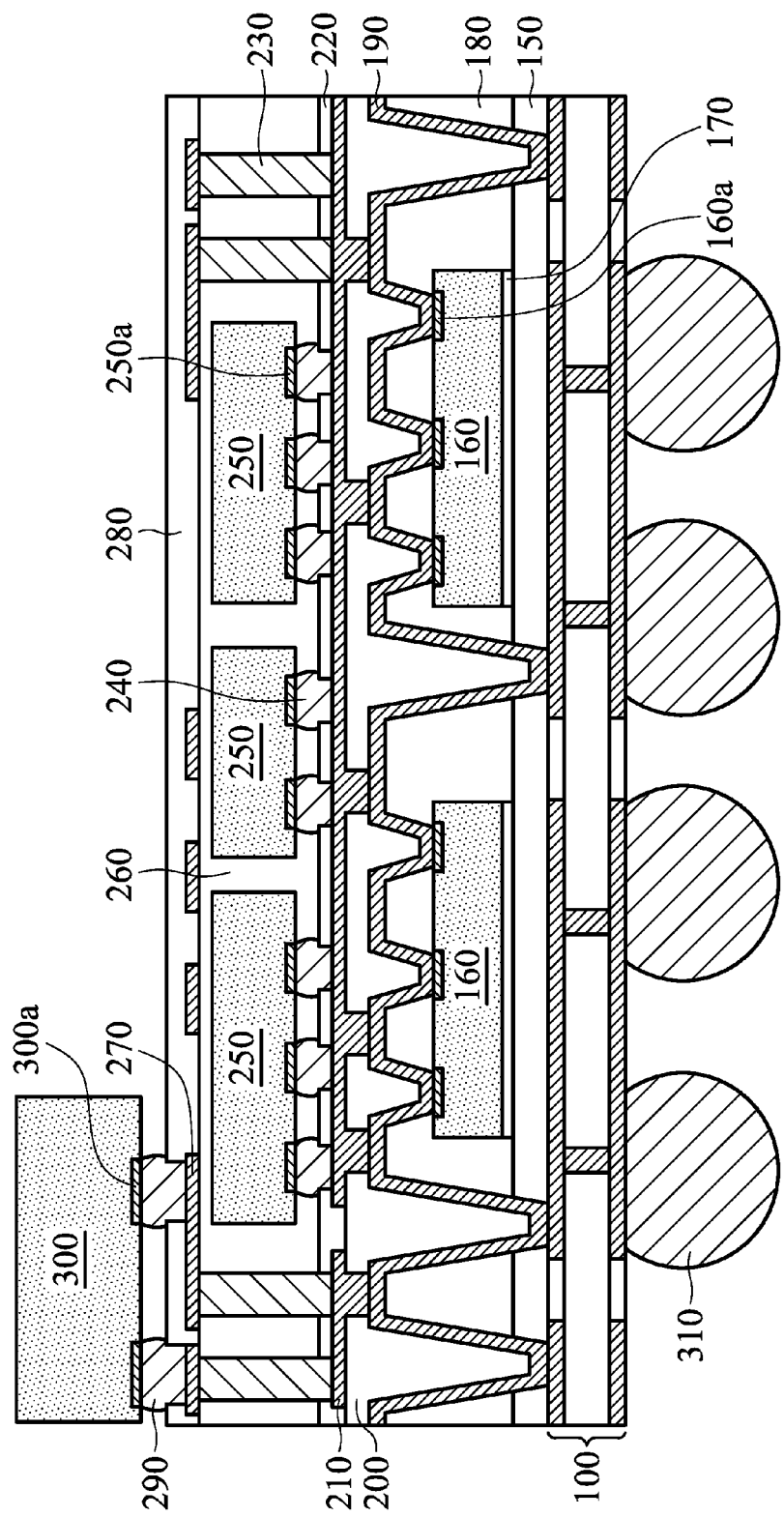

As shown in FIG. 1F, multiple openings are formed in the solder mask layer 280 to expose a portion of the conductive layer 270. In some embodiments, the openings are formed in the solder mask layer 280 by a laser drilling process, an etching process or another applicable process.

Subsequently, a third electronic component 300 is provided. In some embodiments, the third electronic component 300 includes an active component, or a passive component. For example, the third electronic component 300 may be a memory die, a logic die including a CPU, a GPU, or a DRAM controller, or another suitable active electronic component. Alternatively, the third electronic component 300 may be an IPD, a capacitor, a resistor, an inductor, a varactor diode or another suitable passive component.

In some embodiments, the third electronic component 300 includes one or more conductive pads 300a at its front side or active surface. The conductive pads 300a are connected to conductive structures 290. In some embodiments, the conductive structures 290 are conductive bumps, conductive pillars, conductive paste structures, or another suitable conductive structure. The conductive structures 290 may include copper, solder, or another suitable conductive material.

Afterwards, the third electronic component 300 is flipped over and is coupled to some exposed portions of the conductive layer 270 through the conductive structures 290. An applicable process (such as a reflow process) is performed to bond the third electronic component 300. As a result, the conductive pads 300a which are connected to the conductive structures 290 face the substrate 100 and the conductive pads 160a of the first electronic components 160. In some embodiments, the conductive pillars 230 are positioned between the dielectric layers 180 and the third electronic component 300. In some other embodiments, an underfill material is formed between the third electronic component 300 and the solder mask layer 280 to surround the conductive structures 290.

Subsequently, conductive structures 310 are formed below the substrate 100. For example, the conductive structures 310 are bonded to the bottom surface of the insulating layer 110 which faces away from the first electronic components 160, the second electronic components 250, and the third electronic component 300. Accordingly, the conductive structures 310 and the first electronic components 160 are located on two opposite sides of the substrate 100.

The conductive structures 310 are coupled to the conductive layers 130 on the bottom surface of the substrate 100. The conductive structures 310 are electrically connected to the first electronic components 160 through the conductive layers 130 and the vias 140 of the substrate 100, and the conductive layer 190. The conductive structures 310 are electrically connected to the second electronic components 250 through the conductive layers 130 and the vias 140 of the substrate 100, the conductive layer 190, the conductive layer 210, and the conductive structures 240. The conductive structures 310 are electrically connected the third electronic component 300 through the conductive layers 130 and the vias 140 of the substrate 100, the conductive layer 190, the conductive layer 210, the conductive pillars 230, the conductive layer 270, and the conductive structures 290.

In some embodiments, the conductive structures 310 are conductive bumps, conductive pillars, conductive paste structures, or another suitable conductive structure. The conductive structures 310 may include copper, solder, or another suitable conductive material. In some embodiments, the size of the conductive structures 310 is greater than the size of the conductive structures 240 and 290.

In accordance with some embodiments of the disclosure, the substrate 100 is a panel or wafer. A singulation process is performed on the substrate 100 with multiple electronic components 160, 250, and 300. For example, the substrate 100, the dielectric layers 150, 180, and 200, the solder mask layer 220, the molding compound 260 and the solder mask layer 280 are diced. As a result, multiple packages including multiple electronic components 160, 250, and 300 are formed by a wafer process or a panel process so that the fabrication cost is reduced. Therefore, an innovated three-dimensional (3D) system-in-package (SIP) semiconductor package structure is provided. In some embodiments, the substrate 100 is a panel which has more usable area than a wafer, and multiple SIP semiconductor package structures are fabricated from the panel so as to reduce the fabrication cost even further.

Figure 1G:
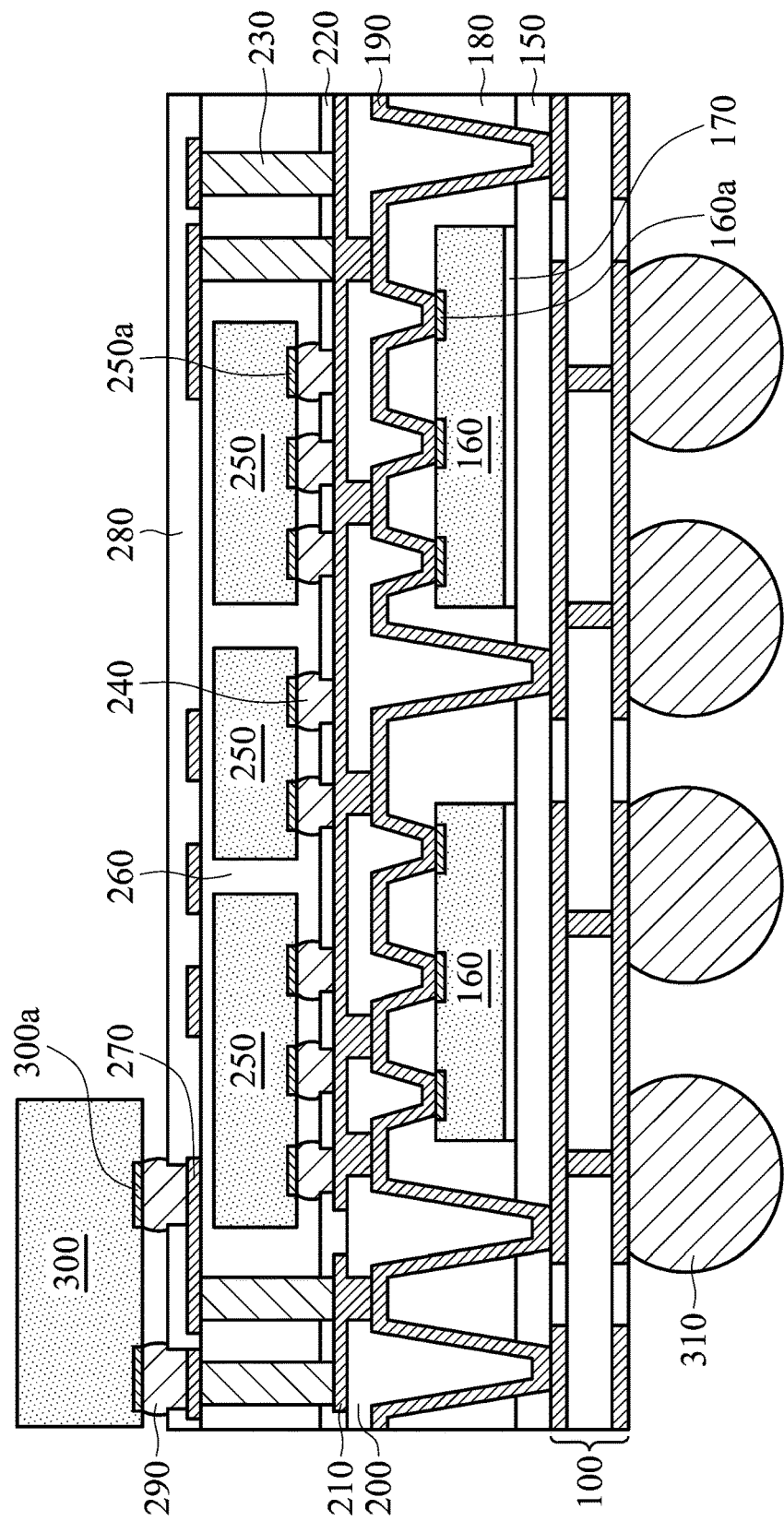

As shown in FIG. 1F, the third electronic component 300 is stacked on the second electronic components 250 and the first electronic components 160. The second electronic components 250 are vertically between the third electronic component 300 and the first electronic components 160. In some embodiments, the third electronic component 300 vertically overlaps the first electronic components 160. In some embodiments, the third electronic component 300 vertically overlaps the second electronic components 250. In some other embodiments, the third electronic component 300 does not vertically overlap the first electronic components 160 and/or the second electronic components 250. In some embodiments, the first electronic component 160 vertically overlaps the conductive pillar 230, as shown in FIG. 1G.

Embodiments of the disclosure are not limited thereto. In some embodiments, there are multiple third electronic components 300 vertically stacked on the second electronic components 250 and the first electronic components 160. The third electronic components 300, the second electronic components 250 and the first electronic components 160 may have the same function or different functions. The third electronic components 300, the second electronic components 250 and the first electronic components 160 may be the same size or different sizes. The actual number, function and size of the third electronic components 300, the second electronic components 250 and the first electronic components 160 are determined by design requirements and they are not limited.

Many variations and/or modifications can be made to embodiments of the disclosure. In some embodiments, the SIP semiconductor package structure is a semiconductor package including multiple stacked electronic components 160 and 250. Afterwards, another package may be vertically stacked on the semiconductor package including the electronic components 160 and 250 so as to form a package-on-package (POP) semiconductor package structure. For example, the third electronic component 300 shown in FIG. 1F may be replaced by a suitable package. This package can be bonded to the conductive layer 270 through the conductive structures 290.

The semiconductor package structure and methods for forming the same in accordance with some embodiments of the disclosure provide various advantages. The semiconductor package structure includes at least two vertically stacked electronic components. Multiple electronic components with various functions (such as chips, passive components or IPDs) can be integrated in a single semiconductor package structure. Electronic component fabricated from different technology nodes can be integrated together as well. Accordingly, the semiconductor package structure is heterogeneous integration. Moreover, the size (in particular to the lateral size) of the semiconductor package structure is significantly reduced. The device density or number of input/output (I/O) connections of the semiconductor package structure is also increased. Therefore, the semiconductor package structure and methods for forming the same in accordance with some embodiments of the disclosure can provide miniaturization and multi-functionality of electronic products. Diverse electronic products (such as wearable devices or another applicable electronic product) can be fabricated according to some embodiments of the disclosure.

Furthermore, various active and/or passive components can be embedded in a single semiconductor package structure. As a result, the signal transmitting path/distance between the electronic components is greatly shortened. Therefore, the semiconductor package structure has good signal integrity and good power integrity. As a result, the electrical performance of the semiconductor package structure is improved. For example, the semiconductor package structure has a better signal integrity/power integrity (SI/PI) performance.

Embodiments of the disclosure further provide the semiconductor package structure with enhanced thermal solution. One or more conductive pillars (such as vertical copper vias) are embedded in the molding compound which has poor thermal conductivity. As a result, one or more efficient thermal dissipation paths can be constructed in the semiconductor package (such as high power consumption devices). Therefore, the quality and reliability of the semiconductor package structure is significantly improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a first electronic component on an insulating layer;
a dielectric layer on the insulating layer and surrounding the first electronic component;
a second electronic component stacked on the first electronic component, wherein an active surface of the first electronic component faces an active surface of the second electronic component;
a molding compound on the first electronic component and surrounding the second electronic component;
a third electronic component stacked on the second electronic component and the molding compound; and
a conductive layer on the substrate, wherein a bottom surface of a portion of the conductive layer is non-coplanar with a bottom surface of another portion of the conductive layer.

2. The semiconductor package structure as claimed in claim 1, wherein each of the first electronic component, the second electronic component, and the third electronic component is an active component or a passive component.

3. The semiconductor package structure as claimed in claim 1, wherein a conductive pad of the first electronic component faces a conductive pad of the second electronic component.

4. The semiconductor package structure as claimed in claim 1, wherein a conductive pad of the second electronic component and a conductive pad of the third electronic component face the insulating layer, and a conductive pad of the first electronic component faces away from the insulating layer.

5. The semiconductor package structure as claimed in claim 1, wherein the second electronic component vertically overlaps the first electronic component and the third electronic component.

6. The semiconductor package structure as claimed in claim 1, further comprising a conductive structure below the insulating layer, wherein the conductive structure is electrically connected to the first electronic component, the second electronic component, and the third electronic component.

7. The semiconductor package structure as claimed in claim 1, wherein the dielectric layer is disposed between the insulating layer and the molding compound.

8. The semiconductor package structure as claimed in claim 1, further comprising a conductive pillar on the first electronic component and surrounded by the molding compound, wherein the conductive pillar and the second electronic component are positioned side by side.

9. The semiconductor package structure as claimed in claim 8, further comprising an additional dielectric layer between the insulating layer and the molding compound and surrounding the first electronic component, wherein the conductive pillar is positioned between the additional dielectric layer and the third electronic component.

10. The semiconductor package structure as claimed in claim 8, wherein the third electronic component is stacked on the conductive pillar.

11. The semiconductor package structure as claimed in claim 1, wherein a bottom surface of a portion of the conductive layer is positioned over the first electronic component, and a bottom surface of another portion of the conductive layer is positioned below the first electronic component.

12. A semiconductor package structure, comprising:
a first electronic component on an insulating layer;
a dielectric layer on the insulating layer and surrounding the first electronic component;
a second electronic component stacked on the first electronic component, wherein an active surface of the first electronic component faces an active surface of the second electronic component;
a molding compound on the dielectric layer and surrounding the second electronic component;
a first conductive layer on the molding compound; and
a second conductive layer extending over a top surface of the dielectric layer, wherein the second conductive layer extends into openings in the dielectric layer.

13. The semiconductor package structure as claimed in claim 12, wherein the insulating layer comprises an organic material.

14. The semiconductor package structure as claimed in claim 13, further comprising a conductive structure electrically connected to the insulating layer, wherein the conductive structure and the first electronic component are located on two opposite sides of the insulating layer.

15. The semiconductor package structure as claimed in claim 12, wherein a conductive pad of the first electronic component faces a conductive pad of the second electronic component.

16. The semiconductor package structure as claimed in claim 12, wherein the first electronic component vertically overlaps the second electronic component.

17. The semiconductor package structure as claimed in claim 12, wherein a portion of the molding compound is sandwiched between the first conductive layer and the second electronic component.

18. The semiconductor package structure as claimed in claim 12, further comprising a conductive pillar on the first electronic component and surrounded by the molding compound, wherein the conductive pillar and the second electronic component are positioned side by side.

19. The semiconductor package structure as claimed in claim 18, wherein the first electronic component vertically overlaps the conductive pillar.

20. The semiconductor package structure as claimed in claim 18, wherein a top surface of the conductive pillar is substantially coplanar with a top surface of the molding compound.

21. The semiconductor package structure as claimed in claim 18, wherein the conductive pillar penetrates the molding compound and protrudes from a bottom surface of the molding compound.

22. The semiconductor package structure as claimed in claim 12, wherein a bottom surface of a portion of the second conductive layer in one of the openings is non-coplanar with a bottom surface of another portion of the second conductive layer in another of the openings.

* * * * *